(12) United States Patent
Skörelid et al.

(10) Patent No.: US 9,130,073 B2
(45) Date of Patent: Sep. 8, 2015

(54) METHOD AND AN APPARATUS FOR PRODUCING A SOLAR CELL MODULE AND A SOLAR CELL MODULE

(71) Applicants: SOLARWAVE AB, Gävle (SE); Carl Ljunggren, Gävle (SE); Fredrik Ljunggren, Gävle (SE)

(72) Inventors: Bengt Skörelid, Sandviken (SE); Thomas Larsson, Gävle (SE)

(73) Assignee: Solarwave AB, Gävle (SE)

( * ) Notice: Subject to any disclaimer, the term of this patent is extended or adjusted under 35 U.S.C. 154(b) by 266 days.

(21) Appl. No.: 13/827,346

(22) Filed: Mar. 14, 2013

(65) Prior Publication Data

US 2013/0269768 A1    Oct. 17, 2013

Related U.S. Application Data

(63) Continuation of application No. 13/702,757, filed as application No. PCT/EP2011/059550 on Jun. 9, 2011, now abandoned.

(30) Foreign Application Priority Data

Jun. 10, 2010 (EP) .................................... 10165532

(51) Int. Cl.
| | |
|---|---|
| *H01L 31/18* | (2006.01) |
| *H01L 31/0216* | (2014.01) |
| *H01L 31/20* | (2006.01) |
| *C23C 18/12* | (2006.01) |

(Continued)

(52) U.S. Cl.
CPC ...... *H01L 31/02167* (2013.01); *C23C 14/0005* (2013.01); *C23C 14/0629* (2013.01); *C23C 14/562* (2013.01); *C23C 16/01* (2013.01); *C23C 16/305* (2013.01); *C23C 16/545* (2013.01); *C23C 18/1212* (2013.01); *C23C 18/1295* (2013.01); *H01L 31/18* (2013.01); *H01L 31/1876* (2013.01); *H01L 31/1892* (2013.01); *H01L 31/1896* (2013.01); *H01L 31/206* (2013.01); *Y02E 10/50* (2013.01)

(58) Field of Classification Search
CPC ............ H01L 31/1876; H01L 31/1892; H01L 31/1896
See application file for complete search history.

(56) References Cited

U.S. PATENT DOCUMENTS

| | | | |
|---|---|---|---|
| 4,419,178 A | 12/1983 | Rode | |
| 4,663,828 A | 5/1987 | Hanak | |
| 4,663,829 A | 5/1987 | Hartman et al. | |
| 5,232,860 A | 8/1993 | Kawanishi et al. | |
| 5,589,007 A * | 12/1996 | Fujioka et al. | ............... 136/249 |
| 5,674,325 A | 10/1997 | Albright et al. | |

(Continued)

FOREIGN PATENT DOCUMENTS

EP          41773         12/1981

*Primary Examiner* — Evan Pert
(74) *Attorney, Agent, or Firm* — Dilworth & Barrese, LLP.

(57) ABSTRACT

A method for producing a continuous film of at least one solar cell module comprises the steps of depositing (8) a material forming a release layer onto a surrogate substrate in the form of a belt (1) being moved in a continuous loop, depositing (12, 14, 17) layers forming a solar cell film onto said release layer, applying (25) a first protective plastic layer onto the solar cell film, separating (31) a film including at least said solar cell film and said plastic layer attached thereto from said belt, and applying (35) a second protective plastic layer on the side of said film separated opposite to said first protective plastic layer.

17 Claims, 3 Drawing Sheets

(51) Int. Cl.
  *C23C 14/00* (2006.01)
  *C23C 14/06* (2006.01)
  *C23C 14/56* (2006.01)
  *C23C 16/01* (2006.01)
  *C23C 16/30* (2006.01)
  *C23C 16/54* (2006.01)

(56) References Cited

U.S. PATENT DOCUMENTS

| 6,136,141 A | 10/2000 | Glatfelter et al. |
| 2006/0073978 A1 | 4/2006 | Chason et al. |
| 2009/0159119 A1* | 6/2009 | Basol ............................ 136/251 |

* cited by examiner

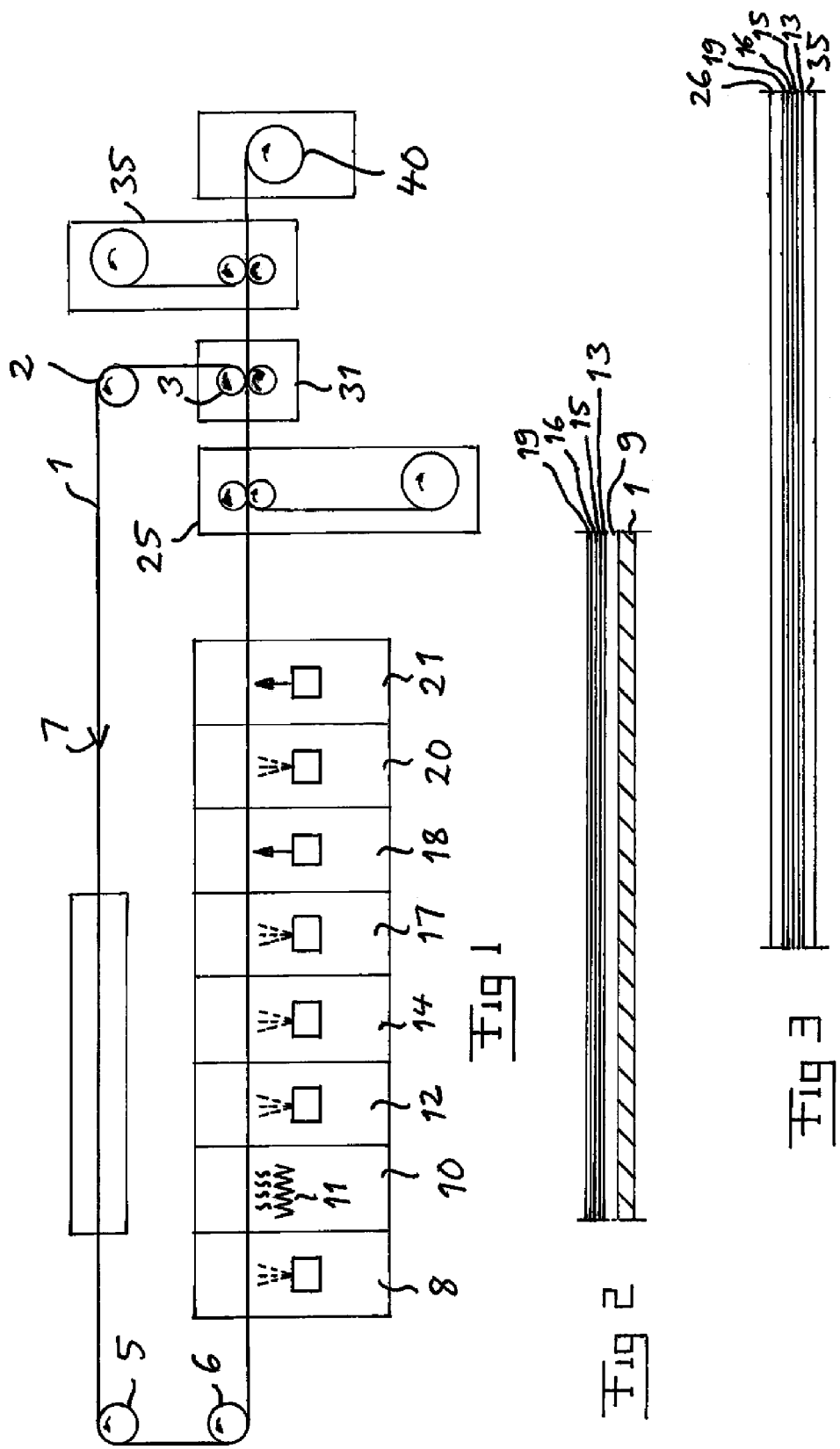

METHOD AND AN APPARATUS FOR PRODUCING A SOLAR CELL MODULE AND A SOLAR CELL MODULE

CROSS-REFERENCE TO RELATED APPLICATION(S)

The present application is a continuation of co-pending U.S. application Ser. No. 13/702,757 filed Dec. 7, 2012, the contents of which are incorporated by reference herein.

TECHNICAL FIELD OF THE INVENTION AND BACKGROUND ART

The present invention relates to a method for producing a continuous film of at least one solar cell module, a solar cell module produced by carrying out such a method as well as an apparatus for continuously producing a continuous film of at least one solar cell module.

A problem in common to known methods for producing solar cell modules is that they are either costly to carry out or otherwise result in a production cost of the solar cell module making it difficult for the solar energy generation technique to successfully compete with other more mature energy generation techniques.

One costly component of solar cell modules may be a rather thick carrier of the solar cell film including active layer and front and back contacts. This thick carrier is mostly made of glass.

A method for producing a continuous film of solar cell modules enabling production of solar cell modules with a much thinner carrier is known through U.S. Pat. No. 4,663,828, in which the carrier may be a thin plastic foil. A similar method is also known through US 2006/0073978 A1.

However, there is of course an ongoing attempt to improve such methods for making solar energy more attractive as energy source.

SUMMARY OF THE INVENTION

The object of the present invention is to provide a method of the type defined in the introduction being improved in at least some aspect with respect to such methods already known.

This object is according to the invention obtained by providing such a method, which comprises the following steps carried out in the order mentioned:

a) depositing a material forming a release layer onto a surrogate substrate in the form of a belt being moved in a continuous loop, b) depositing layers forming a solar cell film onto said release layer, c) applying a first protective plastic layer onto said solar cell film, d) separating a film including at least said solar cell film and said plastic layer attached thereto from said belt, and e) applying a second protective plastic layer on the side of said film separated opposite to said first protective plastic layer, in which step d) is carried out after step c) or in connection therewith.

The combination of these steps makes it possible to reliably produce a very thin film of at least one, in the reality mostly a great number, solar cell module, which may together with the protective plastic layer carriers on both sides of the solar cell film well have a thickness in the order of some millimeters or even less. By depositing a material forming a release layer onto said surrogate substrate the separation of the solar cell film from the surrogate substrate will be facilitated. This separation may be carried out without damaging the solar cell film thanks to the application of said first protective layer onto the solar cell film before or in connection with the separation. It is pointed out that "release layer" is here to be interpreted as a layer applied purely for facilitating separation of the solar cell film from the surrogate substrate and not forming any part involved in the operation of the final solar cell film product.

According to an embodiment of the invention said release layer is in step a) deposited onto a belt, such as a steel belt, having an average surface roughness ≤0.2 µm, ≤0.1 µm or ≤0.05 µm. The use of such a smooth belt as surrogate substrate means that the release layer material may be deposited onto the belt while making a weak contact thereto facilitating said separation. The use of a steel belt as surrogate substrate enables the use of high temperatures during said depositing of layers, which has a positive influence upon the final result of the method.

According to another embodiment of the invention said belt is cleaned after having passed the separating step d) before returning to a place along said loop for carrying out step a) for acting as a surrogate substrate again. Such cleaning is advantageous even if the release layer would in the separating step be totally removed from the belt.

According to another embodiment of the invention a release layer material suited to facilitate said separating of a film in step d) is in step a) deposited onto the belt. Thus, a selection of a material for the release layer having such a nature is advantageous. This nature may involve a weak adherence to the material used for said belt, a substantially different coefficient of thermal expansion than the belt material for enabling use of temperature changes for separation etc.

According to another embodiment of the invention $SiO_2$ is in step a) deposited onto said belt and heated to a temperature, such as 500° C.-700° C., sufficient to convert the structure of the release layer to be glass-like. It has turned out that the use of silicone dioxide as release layer material and heating thereof above the temperature for said conversion will result in a very flush layer easy to separate from said belt, especially a said steel belt.

According to another embodiment of the invention it is CIGS (Copper Indium Gallium Selene) or Si that is deposited in step b) as active layer of said solar cell film.

According to another embodiment of the invention a layer for a back contact or a layer for a front contact of the solar cell film is in step b) deposited onto said release layer, and in the latter case the release layer is removed from said front contact in step d) when the material of the release layer is not transparent to light. Thus, it is possible both to have the back contact and the front contact deposited closest to the belt during the production of the solar cell module, but in the latter case the release layer has to be removed when it is of a material not transparent to light. However, when the release layer material is transparent to light and left onto the front contact it may even increase the efficiency of the solar cell module by providing this with anti-reflecting properties.

According to another embodiment of the invention the method comprises a step f) carried out within said step b) after depositing all layers forming said solar cell film except for an upper contact forming layer of patterning the solar cell film for forming a plurality of solar cells. Said belt may have a considerable width, such as in the order of several meters, and a solar cell having such dimensions will of course not be acceptably efficient, so that a plurality of solar cells, preferably in the form of stripes, to be connected in series are instead produced in this way.

According to another embodiment of the invention the method also comprises a further step g) carried out after step b) and before step c) of dividing said solar cell film into mutually separated solar cell modules. Thus, a plurality of solar cell modules each consisting of a plurality of solar cells will be formed in this way.

According to another embodiment of the invention said first protective plastic layer is in step c) applied onto said solar cell film by pressing a plastic foil onto said film and/or heating said plastic foil and/or applying an adhesive agent to said plastic foil for making said protective plastic layer adhering to said solar cell. These are preferred measures to be taken for applying the first protective plastic layer onto the solar cell film.

According to another embodiment of the invention said film is in step d) subjected to pressure and/or compressed air and/or heat and/or the loop of said belt is diverted for obtaining said separation.

According to another embodiment of the invention said belt with layers deposited thereon is in step e) brought into contact, such as led through a liquid bath, with a material dissolving said release layer. Depending upon the material used for said release layer this may be an advantageous way to separate said film from said belt.

According to another embodiment of the invention the method comprises a step h) carried out after step e) of reeling said film of at least one solar cell module onto a carrier, such as a roller. Accordingly, a supply of solar cell modules to be cut from said roller may in this way be obtained. It is also possible that the material reeled onto said roller forms one extremely long solar cell module, so that solar cell modules of an optional length may be cut from said film.

The invention also relates to a solar cell module produced by carrying out a method according to the present invention. The advantages, especially with respect to low costs, of such a solar cell module appear clearly from the above discussion of the method according to the present invention.

According to an embodiment of the invention said solar cell module has a total thickness of ≤5 mm, ≤50 μm-2 mm, 50 μm-1 mm or 50 μm-200 μm. Such an extremely thin solar cell module may easily be adapted to the shape of surfaces of various designs, so that it may for instance be attached to the roof of a car.

The invention also relates to an apparatus for continuously producing a continuous film of at least one solar cell module according to the appended independed apparatus claim. Such an apparatus may be used to produce a high quality solar cell module to a competitive cost.

Further advantages as well as advantageous features of the invention will appear from the following description of embodiments of the invention.

BRIEF DESCRIPTION OF THE DRAWINGS

With reference to the appended drawings, below follows a specific description of embodiments of the invention cited as examples.

In the drawings:

FIG. 1 is a very schematical view illustrating an apparatus for continuously producing a continuous film of at least one solar cell module according to an embodiment of the invention and which may be used for explaining different steps of methods for producing a continuous film of at least one solar cell module according to different embodiments of the invention, FIG. 2 is a simplified cross-section view not according to scale of a part of a belt with layers applied thereon after carrying out step b) of a method according to the present invention, FIG. 3 is a view corresponding to FIG. 2 showing the layers of a solar cell module according to the present invention.

DETAILED DESCRIPTION OF EMBODIMENTS OF THE INVENTION

Figure 4:
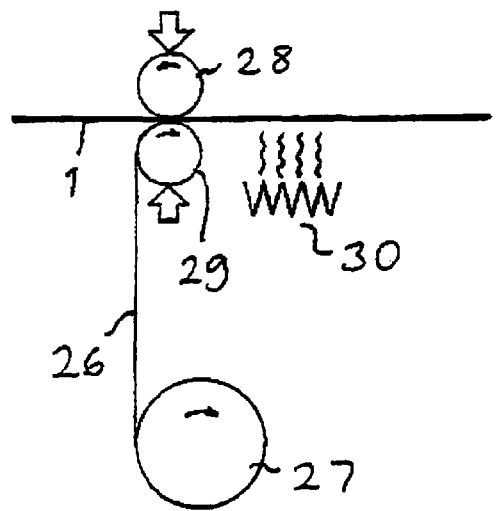
FIG. 4 is a simplified view illustrating how a protective plastic layer may be applied onto a solar cell film in a method according to the present invention.

Methods for producing a continuous film of at least one solar cell module according to different embodiments of the invention will now be described while referring to FIG. 1 showing the general construction of an apparatus for continuously producing a continuous film of at least one solar cell module according to an embodiment of the invention while in parallel making reference to FIG. 2-8 for explaining different steps of such a method.

The apparatus comprises an endless belt 1 preferably of steel with a low average surface roughness and means in the form of diverting rollers 3-6 configured to move the belt 1 in a continuous loop in the direction of the arrow 7. The belt may have a width of as much as 500 cm and a length of more than 100 meters.

The belt is configured to form a surrogate substrate and will in the path along said loop first reach a chamber 8 in which a release layer 9 (see FIG. 2) is deposited onto the belt 1. The release layer may be deposited by for instance spraying the release layer material onto the belt or immersing the belt into a bath of said material. The thickness of the layer 9 may for example vary between 20 nm and 50 μm.

The belt with release layer is then in a subsequent chamber 10 heated by heating means 11 for converting the structure thereof so as to obtain suitable properties thereof for function as a release layer. In the case of $SiO_2$ this may mean a heating to a temperature of 500° C.-700° C. converting $SiO_2$ into a flush glass-like structure.

The belt with release layer is then entering a further chamber 12 in which a layer of a back contact 13 is deposited onto the release layer. This back contact is designed to form the minus pole of the solar cell module to be produced. A suitable material for this contact 13 is Mo, and it is preferably obtained by PVD (Physical Vapor Deposition).

The belt is after that entering a chamber 14 in which an active layer 15 of the solar cell film is deposited onto said back contact layer 13 by any suitable deposition technique, such as CVD (Chemical Vapor Deposition). Examples of materials for the active layer are CIGS (Cu, In, Ga and Se) and Si.

A buffer layer 16, which may be needed when a material for a front contact and the material of the active layer will not like each other, is in a further chamber 17 deposited onto the active layer 15, for instance by PVD or CVD. Cds and ZnO are possible materials for the buffer layer.

The belt is then entering a chamber 18 in which the solar cell film produced in the chamber 12, 14 and 17 is patterned by laser for obtaining a plurality of solar cells. A front contact layer is then formed in a chamber 20 by depositing a material being transparent to light onto the buffer layer 16. ZnO doped with Al is a possible material for the transparent front contact.

The solar cell film so produced will then be cut in a subsequent chamber 21 by laser means 22 into mutually separated solar cell modules. However, it is pointed out that the layers for the solar cell film may be deposited over the entire surface of the belt, but they may also be deposited over restricted regions of the endless belt.

Figure 8:
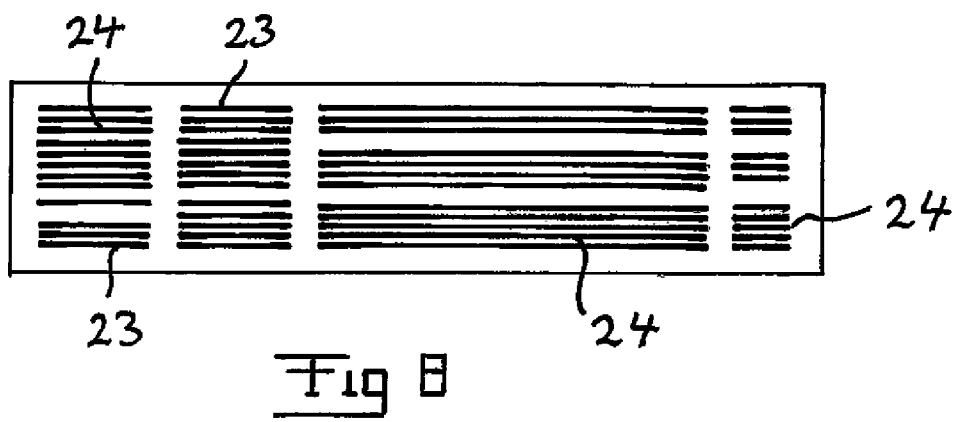
FIG. 8 is a simplified view illustrating a possible appearance of a film produced according to an embodiment of the present invention to be reeled onto a roller and having solar cell modules of different dimensions located thereon.

FIG. 8 illustrates a possible result of the patterning in the chamber 18 and the cutting in the chamber 21, in which each stripe 23 is a solar cell and a number of adjacent stripes forming a group of stripes and separated from other such groups form a solar cell module 24. It appears that solar cell modules with different shapes may in this way be formed.

The total thickness of the layers 13, 15, 16 and 19 forming the solar cell film is typically 3-4 µm.

It is shown in FIG. 1 how the belt is then led to a station 25, in which a first protective plastic foil 26 is supplied to the belt and applied on said front contact layer 19 by being fed from a supply roller 27 and pressed by pressing rollers 28, 29 onto the front contact layer. Heat may also be applied to the plastic foil for obtaining an improved adhesion thereof to the solar cell film, which is indicated by heating means 30 in FIG. 4. A glue may also be applied for obtaining proper adhesion of the foil to the solar cell film. The thickness of the plastic foil is typically in the order of 1-100 µm. Ethylvinylacetate (EVA), polyimide, fluoropolymer or acryl are possible materials for a thin plastic foil being transparent, which is a requirement when the layer adjacent thereto is the front contact.

Figure 5:
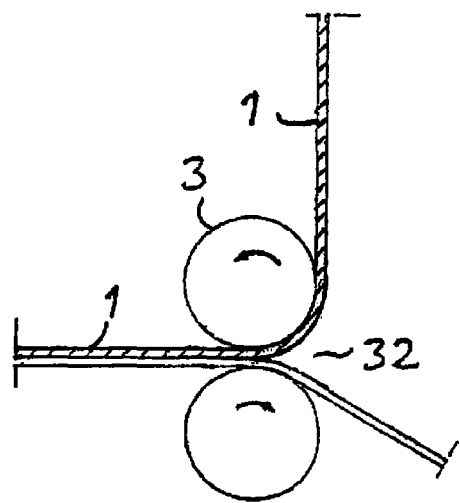
FIG. 5 is a schematic view illustrating the step of separating a film including at least a solar cell film and a protective plastic layer attached thereto from said belt.
Figure 6:
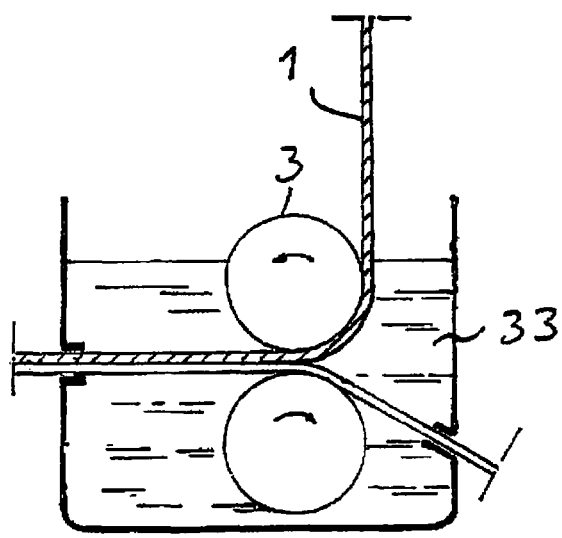
FIG. 6 is a schematic view illustrating another possibility to obtain said separation.
Figure 7:
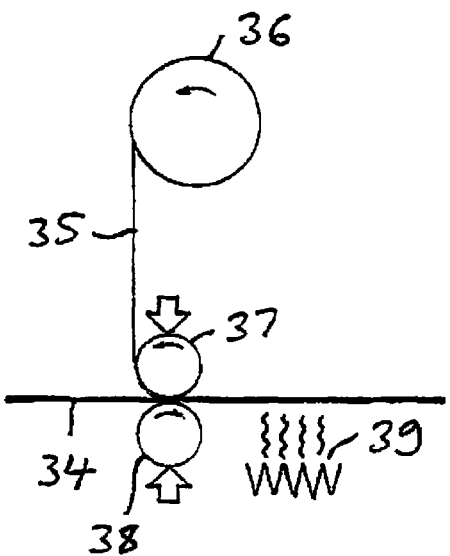
FIG. 7 is a schematic view illustrating the application of a second protective plastic layer on the film separated.

The solar cell film with a protective plastic foil attached to one side thereof will then follow the belt into a separating station 31, in which a film including at least said solar cell film and said plastic foil attached thereto is separated from the belt. How this separation may be achieved is illustrated in FIGS. 5 and 6. FIG. 5 illustrates how said film is separated from the belt by diverting the belt 1 and applying a traction force to the solar cell film with plastic foil downwardly. This may be combined with applying compressed air in the region 32 for promoting said separation.

FIG. 6 shows another possibility of obtaining said separation by bringing the belt with layers deposited thereon into contact with a material dissolving the release layer. This is obtained by leading the belt with said layers through a liquid bath 33 in connection with the diverting of the belt 1. An alternative is to use a dissolving gas for removal of the release layer.

The separation step results in a solar cell film supported only by a thin plastic foil. The solar cell film with plastic foil 34 is then led to a station 35 (see FIG. 7) in which a second protective plastic foil 35 is fed from a supply roller 36 for application and attachment on the side of said solar cell film separated opposite to the first protective plastic foil. This application may as in the station 25 be obtained by the use of pressure rollers 37, 38 and heating means 39. The foil 35 may be thicker than the foil 26 when located on the backside of the solar cell film and not influencing the light transparence of the solar cell film and it has not to be transparent at all.

The continuous film of solar cell modules so produced, which may have an appearance shown in FIG. 8 or any other optional appearance, is then reeled onto a carrier 40 in the form of a roller, in which this reeling is controlled by a system stretching and winding said film onto the roller 40. The length of a solar cell module film reeled on the roller may be several hundreds of meters.

The endless belt will along the loop after the station 31 for said diverting pass a cleaning station 41 in which possibly remainders of release layer material or other waste material is removed from the belt, so that this is totally clean when returning to the chamber 8 for functioning as a surrogate substrate again. Cleaning means in the station 41 may for example use ultrasound or act mechanically or chemically upon the belt for said cleaning.

Figure 9:
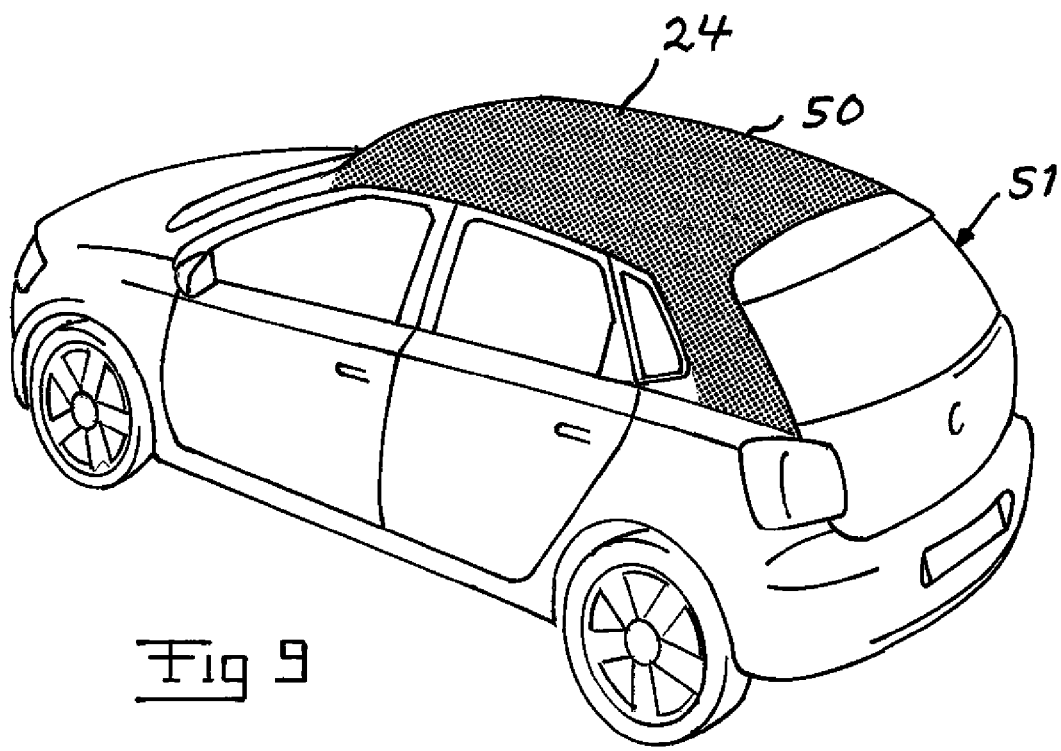
FIG. 9 is a very schematic view illustrating a possible application of a solar cell module according to the present invention.

A solar cell module film having a sufficiently strength to be handled but at the same time so thin that it may be adapted to follow different shapes of objects to which it is applied may be produced through the method according to the invention. FIG. 9 illustrates how such a thin solar cell module 50 may be secured onto the roof of a car 51 while following the shape of said roof.

Solar energy produced by such a solar cell module may for instance be used for operation of an air conditioning system of a car being parked without draining energy from the batteries of the car, so that the compartment of the car may have a pleasant temperature even if the car has been exposed to immediate sunshine. The number of possible applications of a solar cell module produced according to the present invention is infinite. Application of such a module on buildings, construction material and electrical appliance are some examples.

The invention is of course not in any way restricted to the embodiments described above, but many possibilities to modification thereof would be apparent to a person with ordinary skill in the art without departing from the scope of the invention as defined in the appended claims.

The first protective plastic layer may be applied to the solar cell film in connection with the separation of the film from the belt, such as being rolled thereonto through the lower roller of the separation station 31.

It is also possible to apply the protective plastic layers by applying a material in melt form, which is then solidified after application onto the solar cell film layers.

The invention claimed is:

1. A method for producing a continuous film of at least one solar cell module comprising the following steps:
    a) depositing a material forming a release layer (9) onto a surrogate substrate in the form of a belt (1) being moved in a continuous loop,
    b) depositing layers (13, 15, 16, 19) forming a solar cell film onto said release layer,
    c) applying a first protective plastic layer (26) onto said solar cell film,
    d) separating a film including at least said solar cell film and said plastic layer attached thereto from said belt, and
    e) applying a second protective plastic layer (35) on the side of said film separated opposite to said first protective plastic layer (26), in which step d) is carried out after step c) or in connection therewith.

2. A method according to claim 1, wherein in step a) said release layer (9) is deposited onto a belt (1), such as a steel belt, having an average surface roughness ≤0.2 µm, ≤0.1 µm or ≤0.05 µm.

3. A method according to claim 1, wherein said belt (1) is cleaned after having passed the separating step d) before returning to a place along said loop for carrying out step a) for acting as a surrogate substrate again.

4. A method according to claim 1, wherein in that in step a) a release layer material suited to facilitate said separating of a film in step d) is deposited onto the belt.

5. A method according to claim 4, wherein in step a) SiO2 is deposited onto said belt and heated to a temperature, such as 500° C.-700° C., sufficient to convert the structure of the release layer (9) to be glass-like.

6. A method according to claim 1, wherein it is CIGS (Copper Indium Gallium Selene) or Si that is deposited in step b) as active layer (15) of said solar cell film.

7. A method according to claim 1, wherein in step b) a layer for a back contact or a layer for a front contact of the solar cell film is deposited onto said release layer, and that in the latter case the release layer is removed from said front contact in step d) when the material of the release layer is not transparent to light.

8. A method according to claim 1, wherein it comprises a step f) carried out within said step b) after depositing all layers forming said solar cell film except for an upper contact forming layer of patterning the solar cell film for forming a plurality of solar cells (23).

9. A method according to claim 8, additionally comprising a further step g) carried out after step b) and before step c) of dividing said solar cell film into mutually separated solar cell modules (24).

10. A method according to claim 1, wherein in step c) said first protective plastic layer (26) is applied onto said solar cell film by pressing a plastic foil onto said film and/or heating said plastic foil and/or applying an adhesive agent to said plastic foil for making said first protective plastic layer adhering to said solar cell film.

11. A method according to claim 1, wherein in step d) said film is subjected to pressure and/or compressed air and/or heat and/or the loop of said belt is diverted for obtaining said separation.

12. A method according to claim 1, wherein in step d) said belt with layers deposited thereon is brought into contact, such as led through a liquid bath (33), with a material dissolving said release layer.

13. A method according to claim 1, additionally comprising a step h) carried out after step e) of reeling said film of at least one solar cell module onto a carrier (40), such as a roller.

14. A method according to claim 2, wherein said belt (1) is cleaned after having passed the separating step d) before returning to a place along said loop for carrying out step a) for acting as a surrogate substrate again.

15. A method according to claim 14, wherein in step a) a release layer material suited to facilitate said separating of a film in step d) is deposited onto the belt.

16. A method according to claim 3, wherein in step a) a release layer material suited to facilitate said separating of a film in step d) is deposited onto the belt.

17. A method according to claim 15, wherein in step a) SiO2 is deposited onto said belt and heated to a temperature, such as 500° C.-700° C., sufficient to convert the structure of the release layer (9) to be glass-like.

\* \* \* \* \*